(12) United States Patent
Hinode et al.

(10) Patent No.: US 9,364,873 B2
(45) Date of Patent: Jun. 14, 2016

(54) SUBSTRATE TREATMENT METHOD AND SUBSTRATE TREATMENT APPARATUS

(71) Applicant: DAINIPPON SCREEN MFG. CO., LTD., Kyoto-shi, Kyoto (JP)

(72) Inventors: Taiki Hinode, Kyoto (JP); Akio Hashizume, Kyoto (JP); Takashi Ota, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 345 days.

(21) Appl. No.: 14/039,695

(22) Filed: Sep. 27, 2013

(65) Prior Publication Data
US 2014/0090669 A1    Apr. 3, 2014

(30) Foreign Application Priority Data

Sep. 28, 2012 (JP) ................. 2012-217642

(51) Int. Cl.
| | |
|---|---|
| H01L 21/306 | (2006.01) |
| H01L 21/311 | (2006.01) |
| C09K 13/04 | (2006.01) |
| C09K 5/14 | (2006.01) |
| B08B 7/00 | (2006.01) |
| H01L 21/4757 | (2006.01) |
| C11D 3/37 | (2006.01) |
| C11D 7/08 | (2006.01) |
| C11D 11/00 | (2006.01) |
| H01L 21/67 | (2006.01) |
| H01L 21/687 | (2006.01) |

(52) U.S. Cl.
CPC ............... *B08B 7/0071* (2013.01); *C09K 5/14* (2013.01); *C09K 13/04* (2013.01); *C11D 3/373* (2013.01); *C11D 7/08* (2013.01); *C11D 11/0041* (2013.01); *C11D 11/0047* (2013.01); *H01L 21/30604* (2013.01); *H01L 21/31111* (2013.01); *H01L 21/47573* (2013.01); *H01L 21/6708* (2013.01); *H01L 21/67051* (2013.01); *H01L 21/67109* (2013.01); *H01L 21/68742* (2013.01)

(58) Field of Classification Search
CPC .............. H01L 21/30604; H01L 21/47573; H01L 21/31111
USPC ...................................... 216/87, 92
See application file for complete search history.

(56) References Cited

U.S. PATENT DOCUMENTS

| | | | |
|---|---|---|---|
| 6,162,370 A | 12/2000 | Hackett et al. | |
| 6,274,505 B1 * | 8/2001 | Ito ................ | H01L 21/67086 216/84 |

(Continued)

FOREIGN PATENT DOCUMENTS

| | | |
|---|---|---|
| JP | H08-302489 A | 11/1996 |
| JP | 2000-133631 A | 5/2000 |

(Continued)

*Primary Examiner* — Michael Kornakov
*Assistant Examiner* — Natasha Campbell
(74) *Attorney, Agent, or Firm* — McDermott Will & Emery LLP

(57) ABSTRACT

The inventive substrate treatment apparatus includes a spin chuck which horizontally holds and rotates a wafer; a heater which is disposed in opposed relation to a lower surface of the wafer held by the spin chuck and heats the wafer from a lower side; a phosphoric acid nozzle which spouts a phosphoric acid aqueous solution to a front surface (upper surface) of the wafer held by the spin chuck; and a suspension liquid nozzle which spouts a silicon suspension liquid to the front surface of the wafer held by the spin chuck. The wafer is maintained at a higher temperature on the order of 300° C. and, in this state, a liquid mixture of the phosphoric acid aqueous solution and the silicon suspension liquid is supplied to the front surface of the wafer.

5 Claims, 7 Drawing Sheets

(56) References Cited

U.S. PATENT DOCUMENTS

2005/0067101 A1 3/2005 Funabashi
2012/0015523 A1 1/2012 Leonhard et al.
2012/0074102 A1 3/2012 Magara et al.

FOREIGN PATENT DOCUMENTS

| JP | 2005-79212 A | 3/2005 |
| JP | 2007-258405 A | 10/2007 |
| JP | 2012-23366 A | 2/2012 |

\* cited by examiner

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus. Exemplary substrates to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of Related Art

In production processes for semiconductor devices, liquid crystal display devices and the like, a phosphoric acid etching process is performed on a substrate having a silicon nitride film and a silicon oxide film formed in a front surface thereof, as required, to selectively remove the silicon nitride film by supplying a higher temperature phosphoric acid aqueous solution as an etching liquid to the front surface of the substrate (see, for example, JP2007-258405A1).

In a substrate treatment apparatus of a batch type adapted to collectively treat a plurality of substrates, the substrates are immersed in a higher temperature phosphoric acid aqueous solution retained in a treatment bath for a predetermined period. In a substrate treatment apparatus of a single substrate treatment type adapted to treat a single substrate at a time, on the other hand, a higher temperature phosphoric acid aqueous solution is spouted from a nozzle toward a substrate held by a spin chuck. The phosphoric acid aqueous solution is supplied to the front surface of the substrate to flow on the front surface of the substrate.

In the substrate treatment apparatus of the batch type, it is necessary to immerse the substrates in the higher temperature phosphoric acid aqueous solution retained in the treatment bath for the predetermined period or longer in order to uniformly perform the phosphoric acid etching process. Therefore, whether the plurality of substrates are collectively treated or a single substrate is treated in the substrate treatment apparatus of the batch type, the same treatment period is required. In the substrate treatment apparatus of the single substrate treatment type, the single substrate can be uniformly treated in a shorter period of time than in the batch type substrate treatment apparatus.

The phosphoric acid etching process can be performed at the highest treating rate (etching rate) when the phosphoric acid aqueous solution is supplied at about its boiling point to the substrate. In the substrate treatment apparatus of the single substrate treatment type, however, the temperature of the phosphoric acid aqueous solution is reduced before the phosphoric acid aqueous solution is supplied to the substrate, even if the phosphoric acid aqueous solution is temperature-controlled at about its boiling point in a tank. This reduces the etching rate of the silicon nitride film to increase the time required for the phosphoric acid etching process, thereby reducing the throughput.

SUMMARY OF THE INVENTION

It is an object of the present invention to improve the etching rate to reduce the time required for the phosphoric acid etching process.

According to a first aspect of the present inventive, there is provided a substrate treatment method, which includes: a higher temperature maintaining step of maintaining a substrate held by a substrate holding unit at a higher temperature that is not lower than 250° C.; and a phosphoric acid/suspension liquid supplying step of supplying a phosphoric acid aqueous solution and a silicon suspension liquid to a front surface of the substrate held by the substrate holding unit.

In the inventive method, the phosphoric acid aqueous solution and the silicon suspension liquid are supplied to the front surface of the substrate maintained at the higher temperature that is not lower than 250° C. The silicon suspension liquid, which contains a great amount of highly heat-conductive silicon (Si) particles, has a heat absorptive property. The heat absorptive property of the silicon suspension liquid prevents the reduction in the temperature of the phosphoric acid aqueous solution on the front surface of the substrate. Thus, the phosphoric acid aqueous solution in contact with the front surface of the substrate is maintained at the higher temperature. This increases the etching rate for the phosphoric acid etching process, thereby reducing the time required for the phosphoric acid etching process.

The etching rate for the phosphoric acid etching process is increased as the temperature of the substrate increases. Therefore, the substrate is preferably maintained at a higher temperature (maintenance temperature) in the higher temperature maintaining step. For example, the maintenance temperature of the substrate may be about 300° C. Of course, the maintenance temperature of the substrate may be not lower than 250° C. and lower than 300° C., or may be higher than 300° C.

In the substrate treatment method according to the first inventive aspect, both a nitride film and an oxide film may be completely removed from the front surface of the substrate held by the substrate holding unit. In this case, the substrate is preferably a silicon substrate. It is herein assumed that the silicon substrate has a silicon nitride/silicon oxide mixed film formed in the front surface thereof. When the phosphoric acid aqueous solution and the silicon suspension liquid are supplied to the front surface of the silicon substrate, the following reactions occur on the front surface of the silicon substrate.

As shown in the following formula (1), phosphoric acid ($H_3PO_4$) in the phosphoric acid aqueous solution reacts with water ($H_2O$) and silicon (Si) in the silicon suspension liquid to provide pyrophosphoric acid ($H_4P_2O_7$).

$$2H_3PO_4 + 3H_2O \rightarrow H_4P_2O_7$$

$$2H_3PO_4 + Si + 3H_2O \rightarrow H_4P_2O_7 + 4H^+ + Si(OH)_4 \quad (1)$$

As shown in the following formula (2), a film of silicon dioxide ($SiO_2$) in the front surface of the silicon substrate reacts with pyrophosphoric acid to provide $H_2SiP_2O_8$ and water.

$$SiO_2 + H_4P_2O_7 \rightarrow H_2SiP_2O_8 + H_2O \quad (2)$$

As shown in the following formula (3), silicon nitride ($Si_3N_4$) in the front surface of the silicon substrate reacts with water to provide ammonia ($NH_3$) and orthosilicic acid ($Si(OH)_4$). In this reaction, phosphoric acid serves as a catalyst.

$$Si_3N_4 + 12H_2O \rightarrow 3Si(OH)_4 + 4NH_3 \quad (3)$$

Orthosilicic acid occurring in the formulae (1) and (3) is deposited on the front surface of the silicon substrate to hinder the etching on the front surface of the silicon substrate.

If the phosphoric acid aqueous solution has a liquid temperature of not lower than 250° C., silicon nitride and orthosilicic acid react with each other to be subjected to a decomposition reaction represented by the following formula (4).

$$Si_3N_4 + 4Si(OH)_4 \rightarrow 7Si + 4NH_3 + 7O_2 + 2H_2O \quad (4)$$

The deposition of orthosilicic acid is reduced by the decomposition reaction represented by the formula (4), and water is generated which is to react with silicon nitride in the reaction represented by the formula (3). Thus, the deposition of orthosilicic acid is reduced, which may otherwise hinder the etching. As a result, the reactions represented by the formulae (1) to (3) are promoted. Since water which is to react with the silicon nitride is generated, the reaction of the formula (3) is particularly promoted.

As described above, the etching rate for the phosphoric acid etching process can be further increased by maintaining the phosphoric acid aqueous solution at the higher temperature by the heat absorptive property of the silicon suspension liquid and by promoting the etching by the decomposition reaction between silicon nitride and orthosilicic acid. As a result, the time required for the phosphoric acid etching process can be further reduced.

The silicon suspension liquid desirably contains silicon at a higher concentration that is not lower than 100 ppm. In consideration of the heat absorptive property of silicon, the silicon concentration of the silicon suspension liquid, is desirably higher, and is preferably a saturated concentration.

According to the first inventive aspect, the phosphoric acid/suspension liquid supplying step may include a phosphoric acid liquid film forming step of forming a liquid film of the phosphoric acid aqueous solution on the front surface of the substrate held by the substrate holding unit, and a silicon suspension liquid supplying step of supplying the silicon suspension liquid to the front surface of the substrate formed with the liquid film of the phosphoric acid aqueous solution after the phosphoric acid liquid film forming step.

In the inventive method, the silicon suspension liquid is supplied to the front surface of the substrate formed with the liquid film of the phosphoric acid aqueous solution. Then, the phosphoric acid aqueous solution and the silicon suspension liquid are mixed on the front surface of the substrate. Thus, a liquid film of a liquid mixture of the phosphoric acid aqueous solution and the silicon suspension liquid can be properly formed on the front surface of the substrate.

As described above, the silicon suspension liquid has a higher heat conductivity. With the liquid film of the liquid mixture of the phosphoric acid aqueous solution and the silicon suspension liquid formed on the front surface of the substrate, therefore, the phosphoric acid aqueous solution and the silicon suspension liquid in the liquid film can be maintained at a higher temperature. Thus, the etching rate can be further increased.

The substrate treatment method according to the first inventive aspect may further include a cleaning step of cleaning the front surface of the substrate held by the substrate holding unit after the phosphoric acid/suspension liquid supplying step.

If silicon particles remain on the front surface of the substrate after the phosphoric acid aqueous solution and the silicon suspension liquid are removed, the silicon particles are liable to contaminate the substrate.

In the inventive method, the front surface of the substrate is cleaned after the phosphoric acid/suspension liquid supplying step. Therefore, no silicon particle is present on the front surface of the substrate after the cleaning step. As a result, generation of particles is prevented.

According to a second inventive aspect, a substrate treatment apparatus is provided, which includes: a substrate holding unit which holds a substrate; a rotation unit which rotates the substrate held by the substrate holding unit; a phosphoric acid/suspension liquid supplying unit which supplies a phosphoric acid aqueous solution and a silicon suspension liquid to a front surface of the substrate held by the substrate holding unit; a heater which heats the substrate held by the substrate holding unit; and a control unit which controls the rotation unit, the phosphoric acid/suspension liquid supplying unit and the heater; wherein the control unit performs a higher temperature maintaining step of maintaining the substrate held by the substrate holding unit at a higher temperature that is not lower than 250° C., and a phosphoric acid/suspension liquid supplying step of supplying the phosphoric acid aqueous solution and the silicon suspension liquid to the front surface of the substrate held by the substrate holding unit simultaneously with the higher temperature maintaining step.

This arrangement provides the same effects as described above.

According to the second inventive aspect, the heater may be disposed below the substrate held by the substrate holding unit.

With this arrangement, the substrate is heated by the heater, so that the phosphoric acid aqueous solution and the silicon suspension liquid are heated in contact with the front surface of the substrate via the substrate. In this case, a resistance heater, for example, may be used as the heater.

According to the second inventive aspect, the heater may include an infrared lamp which emits infrared radiation toward the front surface of the substrate. In this case, the infrared lamp may be disposed in opposed relation to the front surface of the substrate held by the substrate holding unit.

With this arrangement, the phosphoric acid aqueous solution and the silicon suspension liquid supplied to the front surface of the substrate are irradiated with the infrared radiation emitted from the infrared lamp. Silicon particles contained in the silicon suspension liquid have a relatively high infrared radiation absorptivity. Therefore, the silicon particles are heated by the irradiation of the silicon suspension liquid with the infrared radiation, whereby the temperature of the entire silicon suspension liquid is increased. Thus, the phosphoric acid aqueous solution and the silicon suspension liquid on the front surface of the substrate can be maintained at a higher temperature for a longer period of time.

According to the second inventive aspect, the phosphoric acid/suspension liquid supplying unit may include a phosphoric acid nozzle which spouts the phosphoric acid aqueous solution toward the front surface of the substrate held by the substrate holding unit, and a silicon suspension liquid nozzle which spouts the silicon suspension liquid toward the front surface of the substrate held by the substrate holding unit.

With this arrangement, the phosphoric acid aqueous solution is spouted from the phosphoric acid nozzle to the front surface of the substrate. The silicon suspension liquid is spouted from the silicon suspension liquid nozzle to the front surface of the substrate. Thus, a liquid film of a liquid mixture of the phosphoric acid aqueous solution and the silicon suspension liquid can be properly formed on the front surface of the substrate.

According to the second inventive aspect, the phosphoric acid/suspension liquid supplying unit may include a liquid mixture nozzle which spouts the liquid mixture of the phosphoric acid aqueous solution and the silicon suspension liquid to the front surface of the substrate held by the substrate holding unit.

With this arrangement, the liquid mixture of the phosphoric acid aqueous solution and the silicon suspension liquid is spouted from the liquid mixture nozzle. Therefore, the liquid film of the liquid mixture of the phosphoric acid aqueous solution and the silicon suspension liquid can be properly formed on the front surface of the substrate.

According to the second inventive aspect, the substrate treatment apparatus may further include a cleaning liquid nozzle which spouts a cleaning liquid toward the front surface of the substrate held by the substrate holding unit. In this case, the cleaning nozzle may be a two-fluid nozzle which forms liquid droplets of the cleaning liquid by mixing the cleaning liquid and a gas, and spouts the liquid droplets.

The foregoing and other objects, features and effects of the present invention will become more apparent from the following detailed description of preferred embodiments with reference to the attached drawings.

DETAILED DESCRIPTION OF PREFERRED EMBODIMENTS

Figure 1:
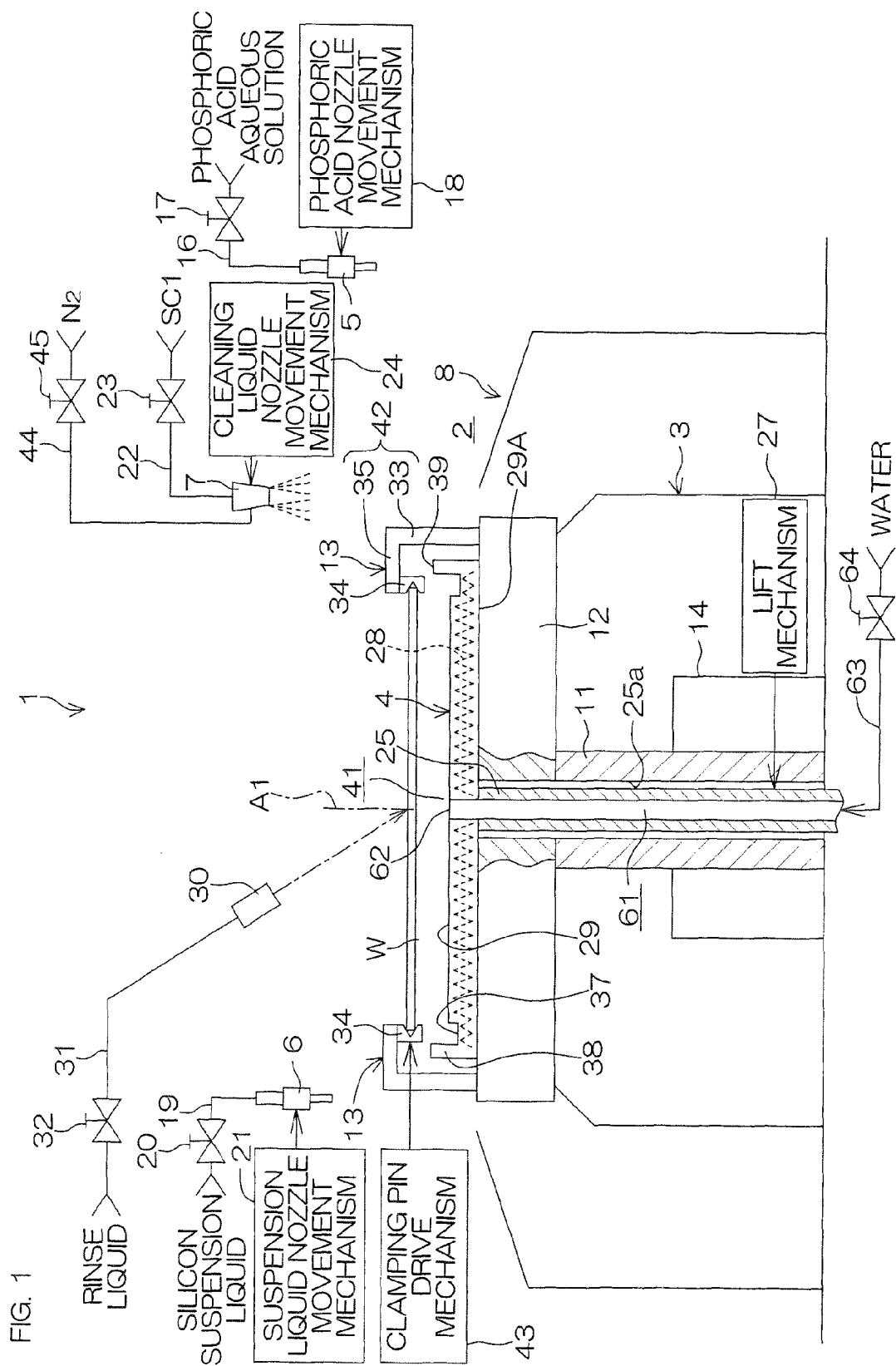
FIG. 1 is a sectional view schematically showing the construction of a substrate treatment apparatus according to a first preferred embodiment of the present invention.

FIG. 1 is a sectional view schematically showing the construction of a substrate treatment apparatus 1 according to a first preferred embodiment of the present invention.

The substrate treatment apparatus 1 is of a single substrate treatment type adapted to perform an oxide film/nitride film etching process on a front surface (on a side including a device formation region) of a round semiconductor wafer W (an example of the substrate, hereinafter referred to simply as "wafer W"). In this etching process, both a nitride film and an oxide film are completely removed from the front surface of the wafer W, and a phosphoric acid aqueous solution is used as the etching liquid.

As shown in FIG. 1, the substrate treatment apparatus 1 includes a treatment chamber 2 defined by a partition wall (not shown), a spin chuck (substrate holding unit) 3 which horizontally holds and rotates the wafer W, a heater 4 disposed in opposed relation to a lower surface of the wafer W held by the spin chuck 3 to heat the wafer W from a lower side, a phosphoric acid nozzle 5 which spouts the phosphoric acid aqueous solution to the front surface (upper surface) of the wafer W held by the spin chuck 3, a suspension liquid nozzle 6 which spouts a silicon suspension liquid to the front surface of the wafer W held by the spin chuck 3, a cleaning liquid nozzle 7 which spouts SC1 (ammonia-hydrogen peroxide mixture as an example of the cleaning liquid) to the front surface of the wafer W held by the spin chuck 3, and a cup 8 in which the spin chuck 3 is accommodated. The spin chuck 3, the heater 4, the phosphoric acid nozzle 5, the suspension liquid nozzle 6, the cleaning liquid nozzle 7 and the cup 8 are provided in the treatment chamber 2.

The spin chuck 3 includes a vertically extending tubular rotation shaft 11, a disk-shaped spin base 12 horizontally attached to an upper end of the rotation shaft 11, a plurality of clamping members 13 (at least three clamping members 13, e.g., 6 clamping members) equidistantly arranged on the spin base 12, and a spin motor (rotation unit) 14 connected to the rotation shaft 11.

The clamping members 13 each include a clamping pin 34 which clamps a peripheral edge portion of the wafer W, and an L-shaped support arm 42 (as seen from a lateral side) which extends upward from a peripheral edge portion of an upper surface of the spin base 12 to support the clamping pin 34. The support arm 42 includes a vertical rod 33 extending vertically upward from the upper surface of the spin base 12, and a horizontal rod 35 extending horizontally from an upper end of the vertical rod 33 toward a rotation axis A1. The vertical rods 33 of the support arms 42 of the respective clamping members 13 are disposed around the heater 4. The horizontal rod 35 is unitary with the vertical rod 33. The clamping pin 34 extends downward from a distal end of the horizontal rod 35, and is vertically attached to the distal end of the horizontal rod 35.

The clamping pin 34 has a V-shaped groove that opens inward. The V-shaped groove is located above a lower end of the clamping pin 34. The peripheral edge of the wafer W is fitted in the V-shaped grooves of the clamping pins 34 of the respective clamping members 13. The clamping pins 34 are connected to a clamping pin drive mechanism 43 which moves the respective clamping pins 34. The clamping pin drive mechanism 43 moves the clamping pins 34 between a clamping position (indicated in FIG. 1) in which the clamping pins 34 clamp the wafer W in contact with a peripheral edge surface of the wafer W and an open position located radially outward of the wafer W from the clamping position.

The spin chuck 3 clamps the wafer W with the clamping pins 34 in contact with the peripheral edge surface of the wafer W. Thus, the wafer W is firmly held by the spin chuck 3. When a rotative drive force of the spin motor 14 is inputted to the rotation shaft 11 with the wafer W held by the respective clamping members 13, the wafer W is rotated about the rotation axis A1 extending vertically through the center of the wafer W. The spin chuck 3 is capable of rotating the wafer W at a maximum rotation speed of 2500 rpm.

The phosphoric acid nozzle 5 is, for example, a straight nozzle which spouts the phosphoric acid aqueous solution downward in the form of a continuous stream. A phosphoric acid supply pipe 16 is connected to the phosphoric acid nozzle 5. The phosphoric acid aqueous solution is supplied at a higher temperature (a temperature not higher than a boiling point of the phosphoric acid aqueous solution defined by the phosphoric acid concentration of the phosphoric acid aqueous solution, e.g., about 140° C.) from a phosphoric acid aqueous solution supply source to the phosphoric acid nozzle 5 through the phosphoric acid supply pipe 16. A phosphoric acid valve 17 which opens and closes the phosphoric acid supply pipe 16 is provided in the phosphoric acid supply pipe 16. With the phosphoric acid valve 17 open, the phosphoric acid aqueous solution is supplied from the phosphoric acid supply pipe 16 to the phosphoric acid nozzle 5. With the phosphoric acid valve 17 closed, the supply of the phosphoric acid aqueous solution from the phosphoric acid supply pipe 16 to the phosphoric acid nozzle 5 is stopped. The phosphoric acid nozzle 5 is connected to a phosphoric acid nozzle movement mechanism 18. The phosphoric acid nozzle movement mechanism 18 moves the phosphoric acid nozzle 5 between a position above the spin chuck 3 and a home position defined on a lateral side of the spin chuck 3.

The suspension liquid nozzle 6 is, for example, a straight nozzle which spouts the silicon suspension liquid downward in the form of a continuous stream. A suspension liquid supply pipe 19 to which the silicon suspension liquid is supplied from a silicon suspension liquid supply source is connected to the suspension liquid nozzle 6. The silicon suspension liquid supplied from the silicon suspension liquid supply source to the suspension liquid supply pipe 19 has, for example, a saturated concentration. A suspension liquid valve 20 which opens and closes the suspension liquid supply pipe 19 is provided in the suspension liquid supply pipe 19. With the suspension liquid valve 20 open, the silicon suspension liquid is supplied from the suspension liquid supply pipe 19 to the suspension liquid nozzle 6. With the suspension liquid valve 20 closed, the supply of the silicon suspension liquid from the suspension liquid supply pipe 19 to the suspension liquid nozzle 6 is stopped.

The suspension liquid nozzle 6 is connected to a suspension liquid nozzle movement mechanism 21 which moves the suspension liquid nozzle 6. The suspension liquid nozzle movement mechanism 21 moves the suspension liquid nozzle 6 between a position above the spin chuck 3 and a home position defined on a lateral side of the spin chuck 3.

The cleaning nozzle 7 is a so-called two-fluid nozzle which causes a liquid droplet jet stream to impinge on the front surface of the wafer W. A cleaning liquid supply pipe 22 to which SC1 is supplied from an SC1 supply source and a nitrogen gas supply pipe 44 to which a high pressure nitrogen gas is supplied from a nitrogen gas supply line (not shown) are connected to the cleaning liquid nozzle 7. A cleaning liquid valve 23 which opens and closes the cleaning liquid supply pipe 22 is provided in the cleaning liquid supply pipe 22. Further, a nitrogen gas valve 45 which opens and closes the nitrogen gas supply pipe 44 is provided in the nitrogen gas supply pipe 44.

With the cleaning liquid valve 23 and the nitrogen gas valve 45 open, the SC1 and the nitrogen gas are respectively supplied from the cleaning liquid supply pipe 22 and the nitrogen gas supply pipe 44 to the cleaning liquid nozzle 7. The SC1 and the nitrogen gas supplied to the cleaning liquid nozzle 7 are mixed together in the vicinity of an outlet port of the cleaning liquid nozzle 7 inside or outside the cleaning liquid nozzle 7. Thus, a jet stream of minute liquid droplets of the SC1 is formed.

The cleaning liquid nozzle 7 is connected to a cleaning liquid nozzle movement mechanism 24 which moves the cleaning liquid nozzle V. The cleaning liquid nozzle movement mechanism 24 moves the cleaning liquid nozzle 7 between a position above the spin chuck 3 and a home position defined on a lateral side of the spin chuck 3.

The substrate treatment apparatus 1 further includes a rinse liquid nozzle 30 which spouts a rinse liquid. The rinse liquid nozzle 30 is, for example, a straight nozzle which spouts a rinse liquid in the form of a continuous stream, and has an supply port disposed above the spin chuck 3 and fixedly directed toward around the rotation center of the wafer W. A rinse liquid supply pipe 31 to which the rinse liquid is supplied at an ordinary temperature (e.g., 25° C.) from a rinse liquid supply source is connected to the rinse liquid nozzle 30. A rinse liquid valve 32 which opens and closes the rinse liquid supply pipe 31 is provided in the rinse liquid supply pipe 31.

The cup 8 has a hollow cylindrical shape which surrounds the spin chuck 3. An upper open end of the cup 8 is located around the spin base 12. A treatment liquid including the phosphoric acid aqueous solution, the silicon suspension liquid and/or the rinse liquid flowing out around the wafer W is received by an interior surface of the cup 8. The treatment liquid received by the cup 8 is introduced into a recovery device or a waste liquid device from the cup 8.

The heater 4 is a resistance heater configured such that a resistor (electric heating wire) is embedded in a main body such as made of a ceramic material or a silicon carbide (SiC). The heater 4 is horizontally disposed between the upper surface of the spin base 12 and the lower surface of the wafer W held by the spin chuck 3. The heater 4 has a greater size than the wafer W as seen in plan. The heater 4 includes a main body 29A having a round flat horizontal upper surface 29, a resistor 28 embedded in the main body 29A, and an outer peripheral wall 38 extending vertically upward from a peripheral edge portion of the upper surface 29 of the main body 29A. The heater 4 has a shallow retention pool 41 defined by the upper surface 29 of the heater 4 and an inner peripheral surface of the outer peripheral wall 38. The heater 4 can retain liquid in the retention pool 41 on the upper surface 29. The height of the outer peripheral wall 38 is defined so that the liquid retained in the retention pool 41 can have a predetermined thickness. The height of the outer peripheral wall 38 is, for example, such that the surface of the liquid is located above the wafer W and a height as measured from the upper surface of the wafer W to the liquid surface is about 5 mm in a state shown in FIG. 4B.

The resistor 28 of the heater 4 is energized through a power supply line (not shown) inserted through a through-hole 25a to be described below. The heater 4 has a nonrotatable structure, requiring no rotary electric contact for the energization of the resistor 28. Therefore, the amount of power supply to the heater 4 is not limited as compared with a case in which the heater 4 is rotatable. Thus, the wafer W can be heated to a desired higher temperature.

By the energization of the resistor 28, the resistor 28 generates heat to bring the entire heater 4 into a heating state. Thus, the upper surface 29 functions as a heat generation surface. The heat generation amount per unit area of the upper surface 29 in the heating state (ON state) of the heater 4 is set uniform on the entire upper surface 29.

The through-hole 25a vertically extends through the spin base 12 and the rotation shaft 11, and a support rod 25 is inserted through the through-hole 25a vertically along the rotation axis A1 (in the thickness direction of the spin base 12) with an upper end thereof fixed to the spin base 12. The support rod 25 contacts neither the spin base 12 nor the rotation shaft 11 in the through-hole 25a. A lower end (the other end) of the support rod 25 is fixed to a peripheral member provided below the spin chuck 3, whereby the support rod 25 is maintained in a proper attitude. Since the heater 4 is not supported by the spin chuck 3, the heater 4 is not rotated but kept stationary (in a nonrotatable state) even during the rotation of the wafer W.

The support rod 25 is a hollow shaft, and a water supply passage 61 through which water such as DIW (deionized water) flows is defined inside the support rod 25. The water supply passage 61 communicates with a lower outlet port 62 which opens in the upper surface 29 of the heater 4. The lower outlet port 62 is opposed to the center of the lower surface of the wafer W held by the spin chuck 3.

A lower water supply pipe 63 to which water is supplied from a water supply source is connected to the water supply passage 61. A lower water valve 64 which opens and closes the lower water supply pipe 63 is provided in the lower water supply pipe 63. With the lower water valve 64 open, the water is supplied to the lower outlet port 62 through the lower water supply pipe 63 and the water supply passage 61. Thus, the water is spouted upward from the lower outlet port 62.

A lift mechanism 27 which moves up and down the heater 4 is connected to the support rod 25. The lift mechanism 27 moves up and down the heater 4 while maintaining the heater 4 in the proper attitude. The lift mechanism 27 includes, for example, a ball screw and a motor. By driving the lift mechanism 27, the heater 4 is moved up and down between a lower position (spaced-apart position, see FIG. 4A) at which the lower surface of the heater 4 contacts the upper surface of the spin base 12 and an upper position (adjacent position, see FIG. 4B) at which the upper surface 29 of the heater 4 is opposed to and spaced a minute distance W1 from the lower surface of the wafer W. Thus, the distance between the heater 4 and the wafer W can be changed.

The heater 4 has an annular groove 37 provided in the peripheral edge portion of the upper surface 29 thereof for accommodating the clamping pins 34 of the clamping members 13 with the heater 4 located at the upper position. The annular groove 37 is annular about the rotation axis A1 so as to accommodate the clamping pins 34 of the clamping members 13 during the rotation of the spin chuck 3 (spin base 12). The annular groove 37 is provided in the retention pool 41. The annular groove 37 has a bottom surface located at a lower level than the upper surface 29 of the heater 4. The annular groove 37 has a depth such that the lower ends of the clamping pins 34 do not interfere with the bottom surface of the annular groove 37 when the heater 4 is located at the upper position. The width of the annular groove (measured radially) is greater than the outer diameter of the clamping pins 34. In FIG. 1, the annular groove 37 is located inward of the outer peripheral wall 38 so as to be radially adjacent to the outer peripheral wall 38. That is, an outer peripheral surface of the annular groove 37 and the inner peripheral surface of the outer peripheral wall 38 are continuous to each other, and are located in the same vertical plane. In other words, the annular groove 37 is partly defined by the inner peripheral surface of the outer peripheral wall 38.

When the retention pool 41 is filled with liquid with the heater 4 located at the upper position, the wafer W clamped by the clamping members 13 with its front surface facing up is immersed in the liquid retained in the retention pool 41. That is, the liquid surface of the liquid retained in the retention pool 41 is located at a higher level than the front surface of the wafer W and, as a result, the front surface of the wafer W is entirely covered with the liquid retained in the retention pool 41.

In FIG. 1, the outer peripheral wall 38 is illustrated as being unitary with the main body 29A of the heater 4 by way of example, but may be separate from the main body 29A of the heater 4.

Figure 2:
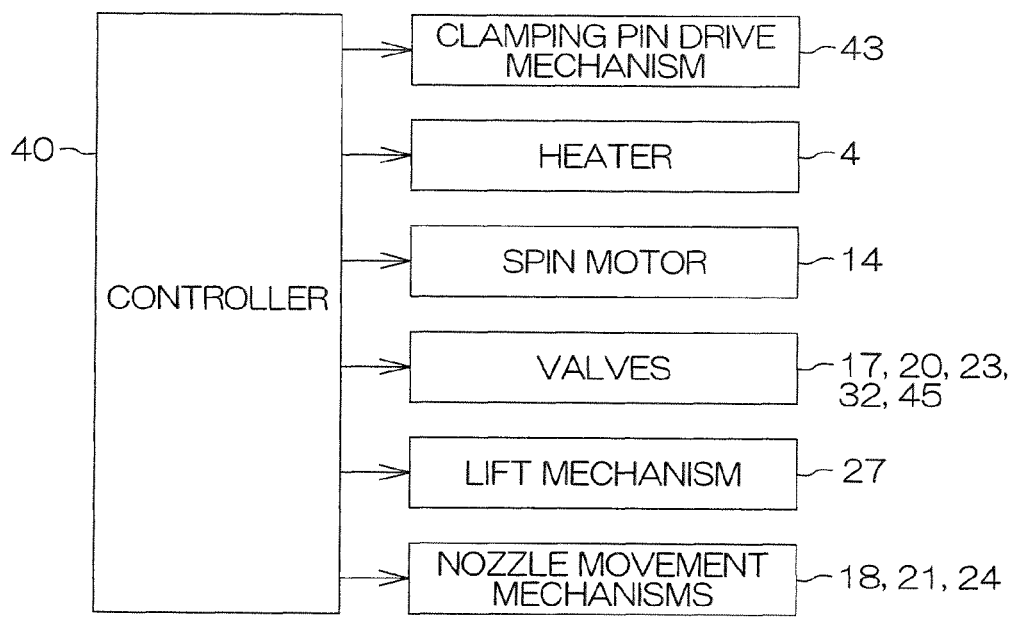
FIG. 2 is a block diagram showing the electrical construction of the substrate treatment apparatus shown in FIG. 1.

FIG. 2 is a block diagram showing the electrical construction of the substrate treatment apparatus 1.

The substrate treatment apparatus 1 includes a controller 40 including a microcomputer. The controller 40 controls the ON/OFF of the heater 4 by switching on and off the energization of the resistor 28. The controller 40 also controls the operations of the clamping pin drive mechanism 43, the spin motor 14, the lift mechanism 27, the phosphoric acid nozzle movement mechanism 18, the suspension liquid nozzle movement mechanism 21 and the cleaning liquid nozzle movement mechanism 24. Further, the controller 40 controls the opening/closing operations of the phosphoric acid valve 17, the suspension liquid valve 20, the cleaning liquid valve 23, the rinse liquid valve 32 and the nitrogen gas valve 45.

Figure 3:
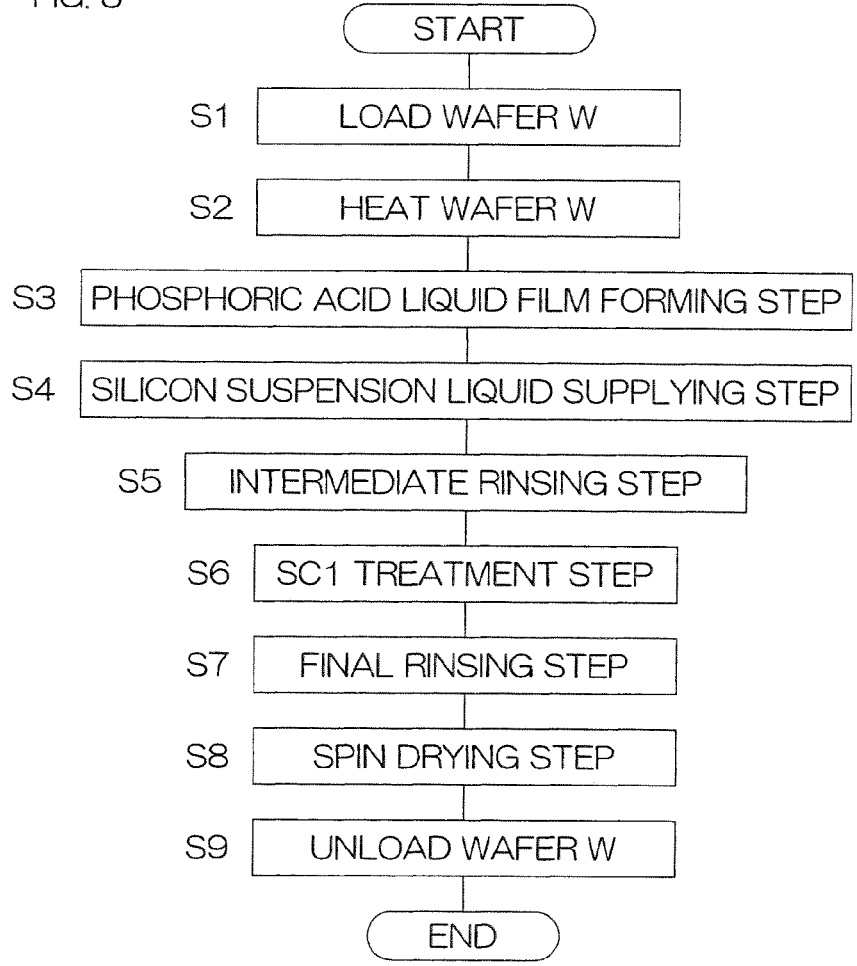
FIG. 3 is a process diagram for explaining an exemplary phosphoric acid etching process to be performed by the substrate treatment apparatus shown in FIG. 1.

FIG. 3 is a process diagram for explaining an exemplary phosphoric acid etching process to be performed by the substrate treatment apparatus 1. FIGS. 4A to 4F are schematic diagrams for explaining this exemplary process.

Referring to FIGS. 1 to 4F, the exemplary phosphoric acid etching process will hereinafter be described.

Figure 4A:
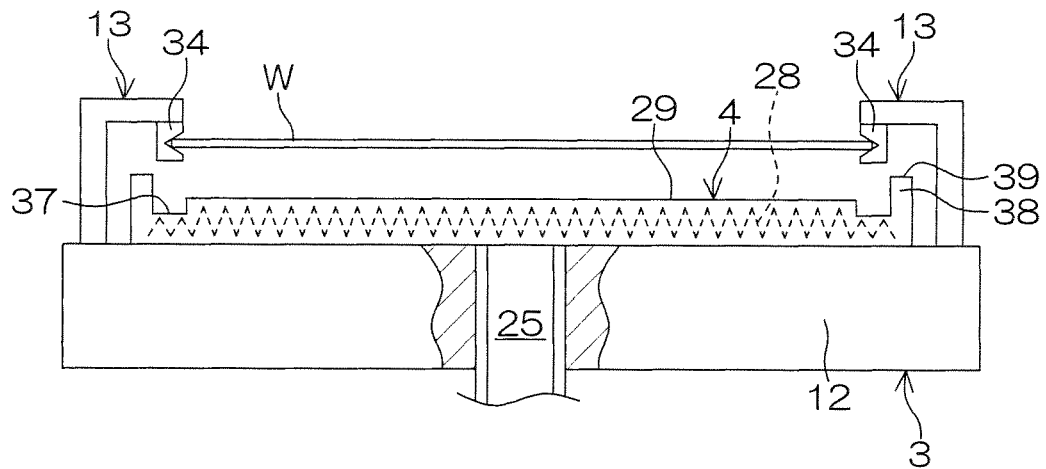
FIGS. 4A, 4B, 4C, 4D, 4E and 4F are schematic diagrams for explaining the exemplary process shown in FIG. 3.

In the phosphoric acid etching process, a transport robot (not shown) is controlled to load an untreated wafer W into the treatment chamber 2 (Step S1). The untreated wafer W has a front surface formed with a nitride film containing silicon nitride ($Si_3N_4$) and an oxide film containing silicon oxide ($SiO_2$) The loaded wafer W is located at a transfer position above the spin base 12. The controller 40 drives the clamping pin drive mechanism 43 to move the respective clamping pins 34 from the open position to the clamping position with the wafer W located at the transfer position. Thus, as shown in FIG. 4A, the loaded wafer W is held by the spin chuck 3 with its front surface facing up.

When the wafer W is loaded, the heater 4 is already kept energized (in a driven state), and is located at the lower position. The phosphoric acid nozzle 5, the suspension liquid nozzle 6 and the cleaning liquid nozzle 7 are respectively located at their home positions so as not to hinder the loading of the wafer W.

Figure 4B:
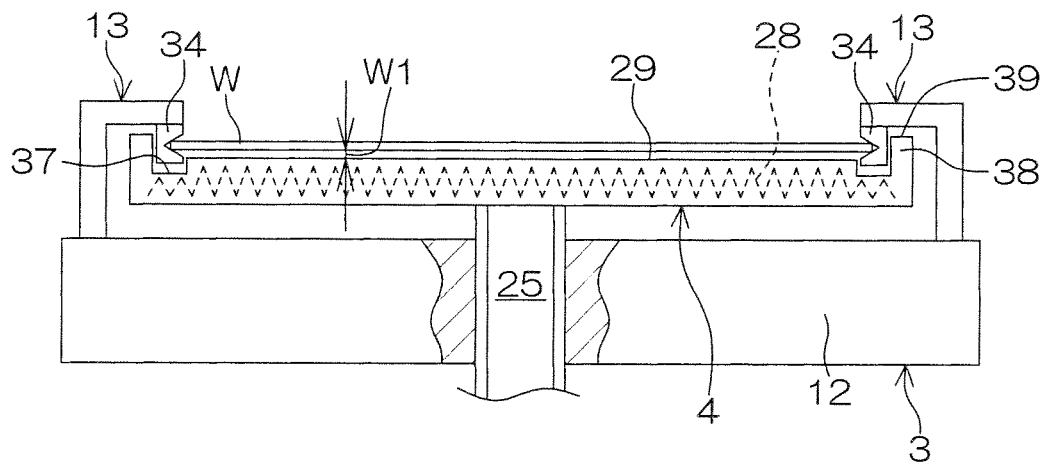

With the wafer W held by the spin chuck 3, as shown in FIG. 4B, the controller 40 controls the lift mechanism 27 to move up the heater 4 to the upper position. In this state, the distance W1 between the lower surface of the wafer W and the upper surface 29 of the heater 4 is, for example, about 0.1 mm. Further, an upper surface 39 of the outer peripheral wall 38 is located at a higher level than the upper surface of the wafer W.

With the heater 4 located at the upper position, the wafer W held by the spin chuck 3 is heated by heat radiation from the heater 4 (Step S2). With the heater 4 located at the upper position, the upper surface 29 of the heater 4 and the lower surface of the wafer W are parallel to each other, so that the heat amount per unit area to be applied to the wafer W by the heater 4 is generally uniform on the entire wafer W. The wafer W is heated up to about 300° C. and maintained at this temperature by the heater 4. The heating of the wafer W is continued for a predetermined heating period.

Figure 4C:
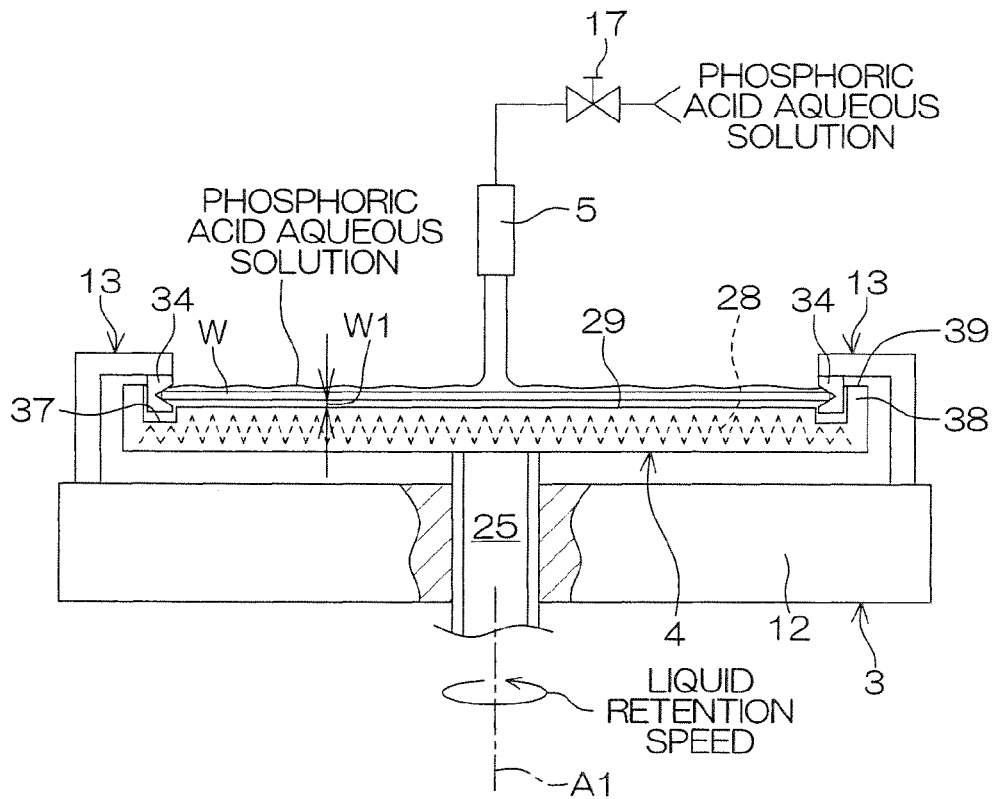

When the temperature of the wafer W reaches about 300° C., as shown in FIG. 4C, the controller 40 controls the spin motor 14 to start rotating the wafer W. The rotation of the wafer W is accelerated up to a predetermined liquid retention speed (in a range of 10 to 100 rpm, e.g., 20 rpm), and maintained at the liquid retention speed.

The controller 40 controls the phosphoric acid nozzle movement mechanism 18 to move the phosphoric acid nozzle 5 to above the wafer W. Thus, the phosphoric acid nozzle 5 is located above the rotation center of the wafer W (on the rotation axis A1) as shown in FIG. 4C.

With the phosphoric acid nozzle 5 located above the rotation center of the wafer W, as shown in FIG. 4C, the controller 40 opens the phosphoric acid valve 17 to spout the higher temperature phosphoric acid aqueous solution from the phosphoric acid nozzle 5. The phosphoric acid aqueous solution spouted from the phosphoric acid nozzle 5 is supplied to the front surface of the wafer W to flow out of the front surface of the wafer W, and is retained in the retention pool 41. The phosphoric acid aqueous solution is retained to the full in the retention pool 41.

Since the heater 4 is located at the upper position, the wafer W is immersed in the phosphoric acid aqueous solution with the retention pool 41 filled with the phosphoric acid aqueous solution. At this time, the liquid surface of the phosphoric acid aqueous solution in the retention pool 41 of the heater 4 is located at a higher level than the front surface of the wafer W. As a result, the entire front surface of the wafer W is covered with the phosphoric acid aqueous solution. In other words, a liquid film of the phosphoric acid aqueous solution covering the entire front surface of the wafer W is formed on the front surface of the wafer W (Step S3: phosphoric acid liquid film forming step).

When the retention pool 41 is filled with the phosphoric acid aqueous solution, the controller 40 closes the phosphoric acid valve 17 to stop spouting the phosphoric acid aqueous solution from the phosphoric acid nozzle 5. Thereafter, the controller 40 controls the phosphoric acid nozzle movement mechanism 18 to move the phosphoric acid nozzle 5 back to its home position.

Figure 4D:
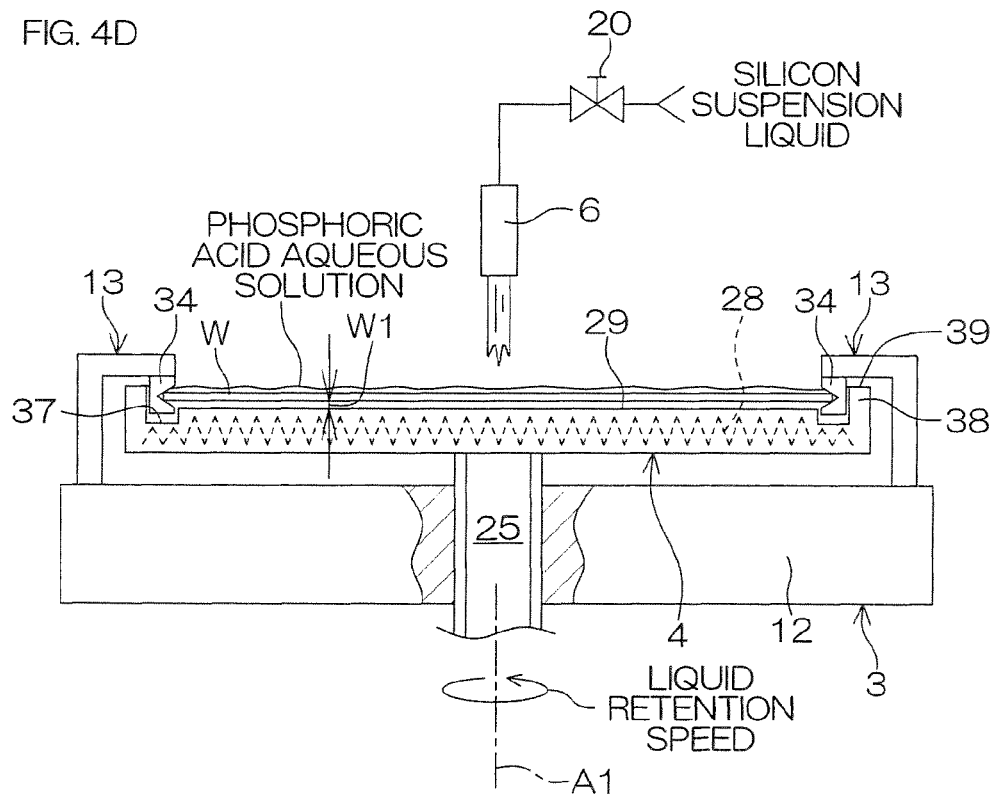

In turn, the controller 40 controls the suspension liquid nozzle movement mechanism 21 to move the suspension liquid nozzle 6 to above the wafer W to locate the suspension liquid nozzle 6 above the rotation center of the wafer W (on the rotation axis A1) as shown in FIG. 4D.

With the suspension liquid nozzle 6 located above the rotation center of the wafer W, the controller 40 opens the suspension liquid valve 20 to spout the silicon suspension liquid from the suspension liquid nozzle 6 (Step S4: silicon suspension liquid supplying step).

That is, the silicon suspension liquid is supplied to the front surface of the wafer W, while the wafer W is rotated at a lower rotation speed with the entire front surface of the wafer W covered with the liquid film of the phosphoric acid aqueous solution. Thus, the phosphoric acid aqueous solution and the silicon suspension liquid are mixed together on the front surface of the wafer W, and a liquid film of the liquid mixture of the phosphoric acid aqueous solution and the silicon suspension liquid (hereinafter sometimes referred to as "phosphoric acid/suspension liquid mixture") is formed on the front surface of the wafer W.

After a lapse of a predetermined silicon suspension liquid spouting period from the start of the spouting of the silicon suspension liquid, the controller 40 closes the suspension liquid valve 20 to stop spouting the silicon suspension liquid from the suspension liquid nozzle 6. Thereafter, the controller 40 controls the suspension liquid nozzle movement mechanism 21 to move the suspension liquid nozzle 5 back to its home position. The silicon suspension liquid spouting period is defined so that the phosphoric acid/suspension liquid mixture retained in the retention pool 41 has a predetermined mixing ratio (e.g., 1:1).

Figure 4E:
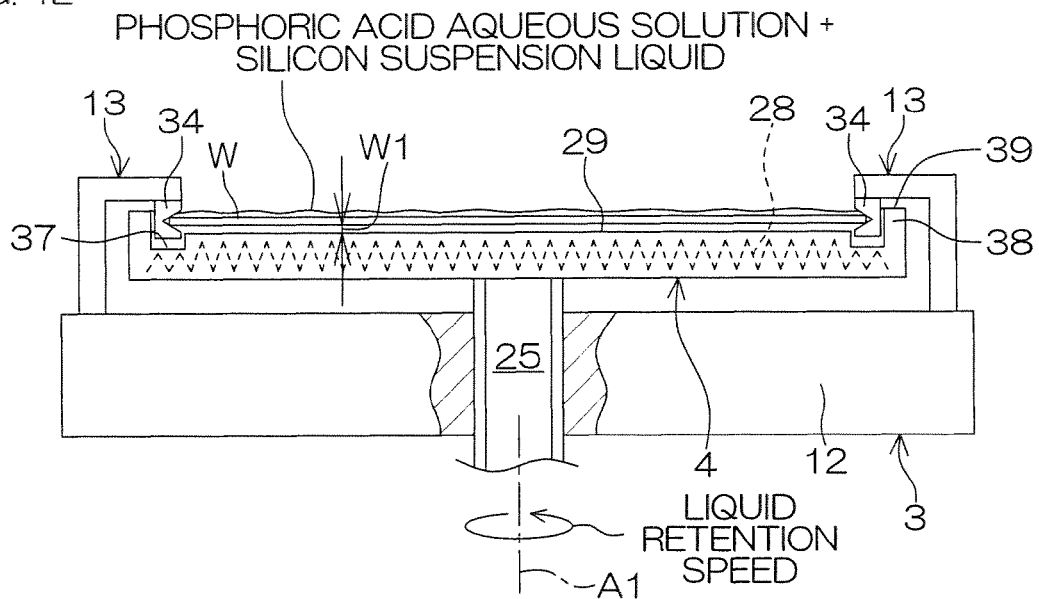

Thereafter, as shown in FIG. 4E, the wafer W is continuously heated by the heater 4, while being rotated at the liquid retention speed with the entire front surface of the wafer W covered with the liquid film of the phosphoric acid/suspension liquid mixture.

In the process step shown in FIG. 4E, the liquid film of the phosphoric acid/suspension liquid mixture is formed on the front surface of the wafer W maintained at a higher temperature on the order of 300° C. The liquid film of the phosphoric acid/suspension liquid mixture is heated by the wafer W. Since the silicon suspension liquid, which contains a great amount of highly heat-conductive silicon (Si) particles, has a heat absorptive property, the reduction in the temperature of the phosphoric acid/suspension liquid mixture is prevented by the heat absorptive property of the silicon suspension liquid.

Further, the following reactions occur on the front surface of the wafer W in the process step shown in FIG. 4E.

As shown in the following formula (5), phosphoric acid ($H_3PO_4$) in the phosphoric acid aqueous solution reacts with water ($H_2O$) and silicon (Si) in the silicon suspension liquid to provide pyrophosphoric acid ($H_4P_2O_7$).

$$2H_3PO_4 + 3H_2O \rightarrow H_4P_2O_7$$

$$2H_3PO_4 + Si + 3H_2O \rightarrow H_4P_2O_7 + 4H^+ + Si(OH)_4 \quad (5)$$

As shown in the following formula (6), the silicon dioxide ($SiO_2$) film in the front surface of the wafer W reacts with pyrophosphoric acid to provide $H_2SiP_2O_8$ and water.

$$SiO_2 + H_4P_2O_7 \rightarrow H_2SiP_2O_8 + H_2O \quad (6)$$

As shown in the following formula (7), the silicon nitride ($Si_3N_4$) film in the front surface of the wafer W reacts with water to provide ammonia ($NH_3$) and orthosilicic acid ($Si(OH)_4$). In this reaction, phosphoric acid serves as a catalyst.

$$Si_3N_4 + 12H_2O \rightarrow 3Si(OH)_4 + 4NH_3 \quad (7)$$

Orthosilicic acid occurring in the reaction represented by the formulae (5) and (7) is deposited on the front surface of the wafer W to hinder the etching on the front surface of the wafer W.

If the phosphoric acid aqueous solution has a liquid temperature of not lower than 250° C., silicon nitride and orthosilicic acid react with each other to be subjected to a decomposition reaction represented by the following formula (8).

$$Si_3N_4 + 4Si(OH)_4 \rightarrow 7Si + 4NH_3 + 7O_2 + 2H_2O \quad (8)$$

The deposition of orthosilicic acid is reduced by the decomposition reaction represented by the formula (8), and water is generated which is to react with silicon nitride in the reaction represented by the formula (7). Thus, the deposition of orthosilicic acid which may otherwise hinder the etching is reduced and, as a result, the reactions represented by the formulae (5) to (7) are promoted. Since water which is to react with the silicon nitride is generated in the decomposition reaction represented by the formula (8), the reaction of the formula (7) is particularly promoted.

Figure 4F:
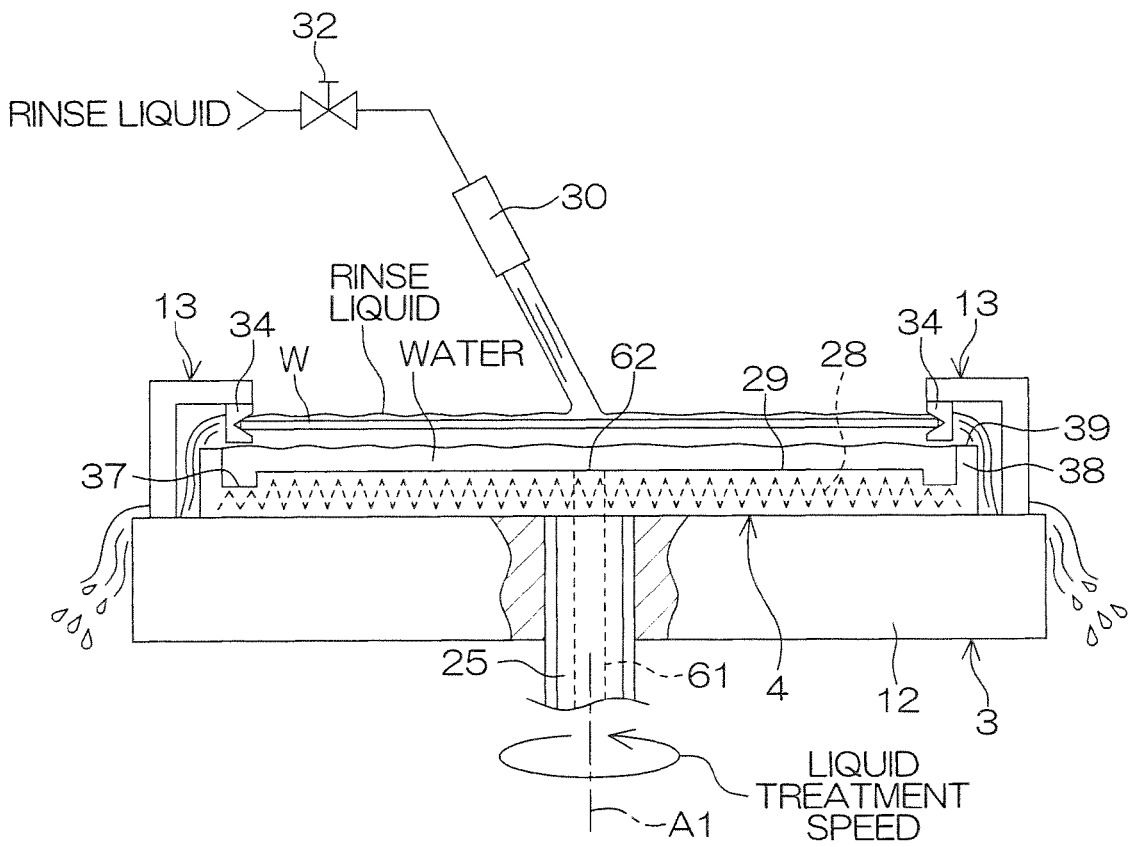

After a lapse of a predetermined heating period from the start of the heating of the wafer W by the heater 4, as shown in FIG. 4F, the controller 40 controls the lift mechanism 27 to move the heater 4 down to the lower position. Thus, the heating of the wafer W by the heat radiation from the heater 4 ends.

Further, the controller 40 controls the spin motor 14 to accelerate the rotation of the wafer W to a predetermined liquid treatment speed (in a range of 300 to 1500 rpm, e.g., 1000 rpm) and maintain the rotation speed at the liquid treatment speed. Thereafter, the controller 40 opens the rinse liquid valve 32 to spout the rinse liquid from the rinse liquid nozzle 30 toward around the rotation center of the wafer W (Step S5: intermediate rinsing step). The rinse liquid supplied to the front surface of the wafer W receives a centrifugal force generated by the rotation of the wafer W to flow toward a peripheral edge of the wafer W on the front surface of the wafer W. Thus, the phosphoric acid aqueous solution and the silicon suspension liquid adhering to the front surface of the wafer W are washed away with the rinse liquid.

Simultaneously with the intermediate rinsing step, a retention pool cleaning step is performed to clean the interior surface (the upper surface 29, the wall surface of the annular groove 37 and the inner peripheral surface of the outer peripheral wall 38) of the heater 4. In the retention pool cleaning step, the controller 40 opens the lower water valve 64 to spout water from the lower outlet port 62. The water spouted from the lower outlet port 62 is retained in the retention pool 41 of the heater 4. The spouting of the water from the lower outlet port 62 is continued even after the water overflows out of the retention pool 41. Thus, the phosphoric acid aqueous solution and the silicon suspension liquid adhering to the interior surface of the heater 4 are washed away with the water.

After the supply of the rinse liquid is continued for a predetermined intermediate rinsing period, the rinse liquid valve 32 is closed to stop supplying the rinse liquid to the front surface of the wafer W. In synchronization with the stop of the supply of the rinse liquid, the lower water valve 64 is closed to stop supplying the water to the heater 4.

While maintaining the rotation speed of the wafer W at the liquid treatment speed, the controller 40 opens the cleaning liquid valve 23 to supply the SC1 from the cleaning liquid nozzle 7 to the front surface of the wafer W (Step S6: SC1 treatment step). The controller 40 controls the cleaning liquid nozzle movement mechanism 24 to move the cleaning liquid nozzle 7 so as to reciprocally move an SC1 liquid applying position between the rotation center of the wafer W and the peripheral edge of the wafer W. Thus, the SC1 liquid applying position is reciprocally moved along an arcuate path crossing the wafer rotation direction as seen in plan in a region extending from the rotation center of the wafer W to the peripheral edge of the wafer W. Thus, the SC1 is evenly supplied to the entire front surface of the wafer W to remove a resist residue, particles and other foreign matter adhering to the front surface of the wafer W by the chemical power of the SC1.

Particularly, it is supposed that silicon particles adhere to the front surface of the wafer W after the intermediate rinsing step of Step S5. If the front surface of the wafer W was dried in this state without the cleaning thereof, the silicon particles would cause contamination of the wafer W. In this exemplary process, however, the silicon particles adhering to the front surface of the wafer W are removed by the chemical power of the SC1 in the SC1 treatment step of Step S6, so that the contamination can be prevented which may otherwise occur due to the silicon particles.

After the supply of the SC1 is continued for a predetermined SC1 treatment period, the controller closes the cleaning liquid valve 23, and controls the cleaning liquid nozzle movement mechanism 24 to move the cleaning liquid nozzle 7 back to its home position. With the rotation speed of the wafer W maintained at the liquid treatment speed, the controller 40 opens the rinse liquid valve 32 to spout the rinse liquid from the rinse liquid nozzle 30 toward around the rotation center of the wafer W (Step S7: final rinsing step). The rinse liquid supplied to the front surface of the wafer W receives a centrifugal force generated by the rotation of the wafer W to flow toward the peripheral edge of the wafer W on the front surface of the wafer W. Thus, the SC1 adhering to the front surface of the wafer W is washed away with the rinse liquid.

After the supply of the rinse liquid is continued for a predetermined rinsing period, the rinse liquid valve 32 is closed to stop supplying the rinse liquid to the front surface of the wafer W.

Thereafter, the controller 40 drives the spin motor 14 to accelerate the rotation of the wafer W to a predetermined higher rotation speed (e.g., 1500 to 2500 rpm) and maintain the rotation speed at the higher rotation speed. Thus, a spin drying process is performed to spin off the rinse liquid from the wafer W to dry the wafer W (Step S8: drying step). The rinse liquid adhering to the wafer W is removed by the spin drying step of Step S8.

The rinse liquid to be supplied to the wafer W in the intermediate rinsing step of Step S5 is not limited to the water (DIW), but may be carbonated water, electrolytic ion water, ozone water, reduced water (hydrogen water), magnetic water or other rinse liquid. Similarly, the rinse liquid to be supplied to the wafer W in the final rinsing step of Step S7 is not limited to the water (DIW), but may be carbonated water, electrolytic ion water, ozone water, reduced water (hydrogen water), magnetic water or other rinse liquid.

After the spin drying step is performed for a predetermined spin drying period, the controller 40 drives the spin motor 14 to stop the rotation of the spin chuck 3. Thus, the phosphoric acid etching process on the single wafer W is completed.

After the spin drying step, the controller 40 locates a hand of the transport robot below the wafer W. In this state, the controller 40 drives the clamping pin drive mechanism 43 to move the clamping pins 34 from the clamping position to the open position. Thus, the treated wafer W is transferred to the transport robot. The wafer W is unloaded from the treatment chamber 2 by the transport robot (Step S9).

According to this preferred embodiment, as described above, the liquid film of the phosphoric acid/suspension liquid mixture is formed on the front surface of the wafer W maintained at a higher temperature on the order of 300° C. Since the silicon suspension liquid containing a great amount of highly heat-conductive silicon particles has a heat absorptive property, the reduction in the temperature of the phosphoric acid aqueous solution is prevented by the heat absorptive property of the silicon suspension liquid. Therefore, the phosphoric acid aqueous solution in contact with the front surface of the wafer W is constantly maintained at the higher temperature. This increases the etching rate (etching amount per unit time) for the phosphoric acid etching process. As a result, the time required for the phosphoric acid etching process can be reduced.

On the front surface of the wafer W maintained at a higher temperature on the order of 300° C., as described above, silicon nitride and orthosilicic acid react with each other to be decomposed to generate water. This reduces the deposition of orthosilicic acid which may otherwise hinder the etching. As a result, the etching is promoted. Further, water which is to react with silicon nitride is generated, so that the decomposition of silicon nitride is particularly promoted.

Thus, the etching rate for the phosphoric acid etching process can be further increased by maintaining the phosphoric acid aqueous solution at the higher temperature by the heat absorptive property of the silicon suspension liquid and by promoting the etching by the decomposition reaction of silicon nitride and orthosilicic acid. As a result, the time required for the phosphoric acid etching process can be reduced.

Figure 5:
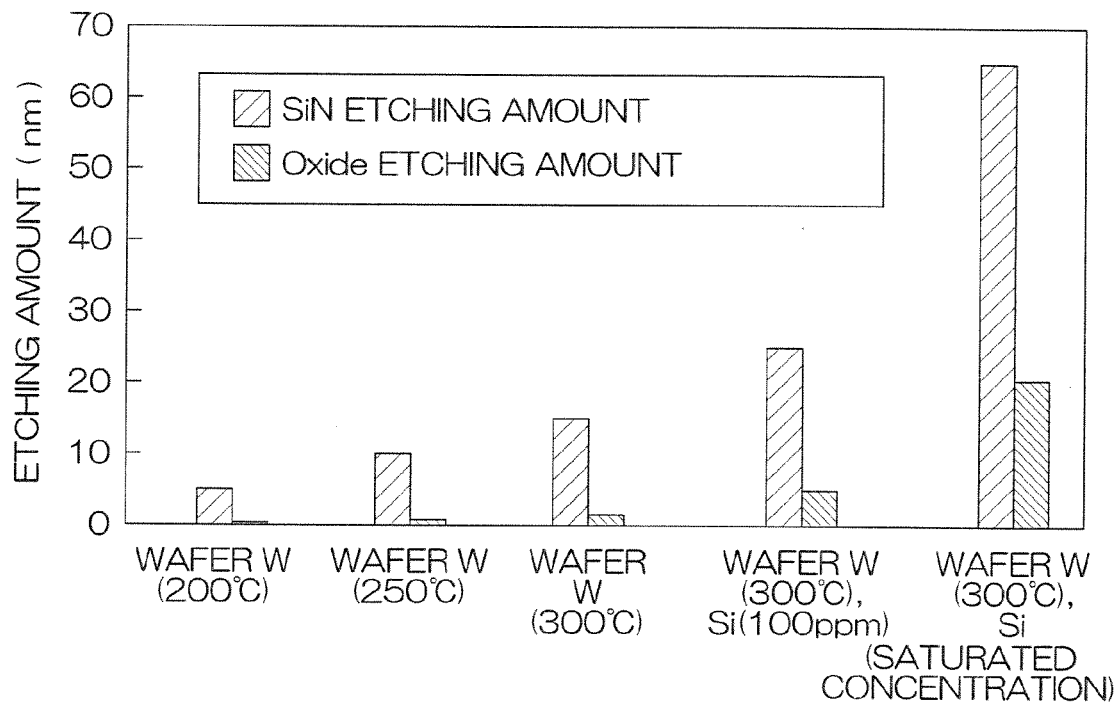
FIG. 5 is a graph showing silicon nitride etching amounts and silicon oxide etching amounts with respect to different wafer temperatures and different types of etching liquids for the phosphoric acid etching process.

FIG. 5 is a graph showing silicon nitride etching amounts (SiN etching amounts) and silicon oxide etching amounts (oxide etching amounts) with respect to different wafer temperatures and different types of etching liquids for the phosphoric acid etching process. In the graph of FIG. 5, the etching amounts (unit: nm) are plotted as ordinate. The measurement values shown in FIG. 5 were obtained when the etching was performed for a constant etching period of two minutes. The three sets of measurement values shown in the left portion of the graph of FIG. 5 were obtained when only the phosphoric acid aqueous solution was used as the etching liquid. The two sets of measurement values shown in the right portion of the graph of FIG. 5 were obtained when the phosphoric acid/suspension liquid mixture was used as the etching liquid. The mixing ratio (volume ratio) between the phosphoric acid aqueous solution and the silicon (Si) suspension Liquid in the phosphoric acid/suspension liquid mixture used for the measurement was 1:1.

FIG. 5 indicates that the silicon nitride etching amount and the silicon oxide etching amount are increased as the temperature of the wafer W increases. FIG. 5 indicates that, where the temperature of the wafer W is not lower than 250° C., the silicon nitride etching amount and the silicon oxide etching amount are particularly great.

A comparison between the three sets of measurement values shown in the right portion of the graph of FIG. 5 indicates that, where the wafer W is maintained at the same temperature, the silicon nitride etching amount and the silicon oxide etching amount are greater in the etching process using the phosphoric acid/suspension liquid mixture as the etching liquid than in the etching process using the phosphoric acid aqueous solution alone as the etching liquid.

Further, a comparison between the two sets of measurement values shown in the right portion of the graph of FIG. 5 indicates that the silicon nitride etching amount and the silicon oxide etching amount are increased as the concentration of silicon (Si) increases in the silicon suspension liquid mixed with the phosphoric acid aqueous solution.

Therefore, both the nitride film and the oxide film can be etched at higher etching rates by using the phosphoric acid/suspension liquid mixture as the etching liquid with the temperature of the wafer W maintained at a higher temperature that is not lower than 250° C. The silicon suspension liquid to be mixed with the phosphoric acid aqueous solution desirably has the highest possible silicon concentration.

Figure 6:
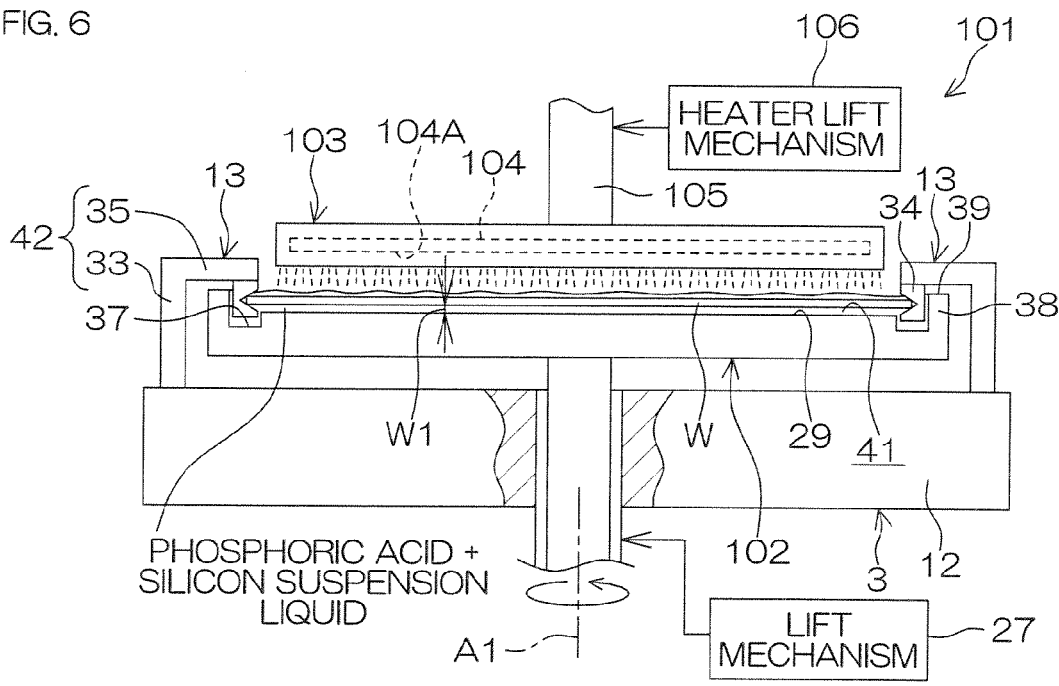
FIG. 6 is a sectional view schematically showing the construction of a substrate treatment apparatus according to a second preferred embodiment of the present invention.

FIG. 6 is a sectional view schematically showing the construction of a substrate treatment apparatus 101 according to a second preferred embodiment of the present invention. In FIG. 6, components corresponding to those shown in the first preferred embodiment will be designated by the same reference characters as in FIGS. 1 to 5, and duplicate description will be omitted.

In the substrate treatment apparatus 101 according to the second preferred embodiment, a liquid retention vessel 102 is provided instead of the heater 4. In the substrate treatment apparatus 101 according to the second preferred embodiment, an infrared heater (heater) 103 such as a halogen lamp which irradiates the front surface of the wafer W with infrared radiation is disposed above the spin chuck 3.

The liquid retention vessel 102 is made of, for example, a ceramic material or a heat-resistant resin. The liquid retention vessel 102 has substantially the same construction as the heater 4 shown in FIG. 1, except that the liquid retention vessel 102 does not function as a heater without the resistor 28 (see FIG. 1) embedded therein. More specifically, the liquid retention vessel 102 has a disk shape, and is horizontally disposed between the spin base 12 and the heater 103. The lift mechanism 27 moves up and down the liquid retention vessel 102 in a horizontal attitude. The liquid retention vessel 102 is moved up and down between a lower position at which its lower surface contacts the upper surface of the spin base 12 and an upper position at which its upper surface 29 is opposed to and spaced a minute distance W1 from the lower surface of the wafer W by driving the lift mechanism 27. Thus, the distance between the liquid retention vessel 102 and the wafer W can be changed.

The liquid retention vessel 102 has a retention pool 41 defined by the upper surface 29 and an inner peripheral surface of an outer peripheral wall 38 of the liquid retention vessel 102 for retaining liquid on the upper surface 29. Therefore, the liquid retention vessel 102 can retain the liquid on the upper surface 29 thereof. When the retention pool 41 is filled with the liquid with the liquid retention vessel 102 located at the upper position (as shown in FIG. 6), the wafer W with its front surface facing up is entirely immersed in the liquid retained in the retention pool 41. That is, the front surface of the wafer W is entirely covered with the liquid retained in the retention pool 41. Even during the rotation of the wafer W, the liquid retention vessel 102 is not rotated but kept stationary (in a nonrotatable state).

The infrared heater 103 has a disk shape having the same or substantially the same outer diameter as the wafer W, and is held horizontally. In FIG. 6, the outer diameter of the infrared heater 103 is smaller than the inner diameter of the annular groove 37 by way of example. The infrared heater 103 is disposed above the wafer W held by the spin chuck 3. Therefore, the lower surface of the infrared heater 103 is vertically opposed to the front surface of the wafer W held by the spin chuck 3. The infrared heater 103 includes an infrared lamp 104 having an infrared emitting surface 104A provided on a lower side thereof, and a disk-shaped housing which accommodates the infrared lamp 104. The infrared emitting surface 104A is opposed to the entire front surface of the wafer W. The infrared lamp 104 emits infrared radiation toward the front surface of the wafer W. The infrared radiation to be emitted by the infrared lamp 104 has a wavelength in a wavelength range that is absorbable by silicon (Si). The infrared heater 103 is supported from the upper side by a holder 105. A heater lift mechanism 106 which moves up and down the infrared heater 103 is connected to the holder 105. The heater lift mechanism 106 is electrically connected to the controller 40 (see FIG. 2).

When the phosphoric acid etching process shown in FIG. 3 is performed by the substrate treatment apparatus 101, the controller 40 causes the transport robot to transport a wafer W to the spin chuck 3 with the infrared heater 103 located at a retracted position above the clamping members 13 and emitting the infrared radiation. Thus, the infrared heater 103 is significantly retracted above the front surface of the wafer W, and kept in an ON state (in a driven state) when the wafer W is loaded.

The controller 40 controls the lift mechanism 27 to move the liquid retention vessel 102 to the upper position with the wafer W held by the clamping members 13. Thus, the wafer W is entirely located in the retention pool 41 of the liquid retention vessel 102. Thereafter, the controller 40 controls a spin motor (having the same construction as the spin motor 14 shown in FIG. 1) to rotate the wafer W at a liquid retention speed.

In turn, the higher temperature phosphoric acid aqueous solution is supplied to the center portion of the front surface of the wafer W, and retained in the retention pool 41 as in the first preferred embodiment (Step S3 shown in FIG. 3). The front surface of the wafer W is entirely covered with the phosphoric acid aqueous solution retained in the retention pool 41. Thus, a liquid film of the phosphoric acid aqueous solution is formed on the front surface of the wafer W as covering the entire front surface of the wafer W.

Then, the silicon suspension liquid is supplied to the center portion of the front surface of the wafer W, whereby a phosphoric acid/suspension liquid mixture is retained in the retention pool 41 as in Step S4 shown in FIG. 3. The front surface of the wafer W is entirely covered with the phosphoric acid/suspension liquid mixture retained in the retention pool 41. Thus, a liquid film of the phosphoric acid/suspension liquid mixture is formed on the front surface of the wafer W as covering the entire front surface of the wafer W.

Thereafter, the controller 40 controls the heater lift mechanism 106 to move down the infrared heater 103 to an adjacent position at which the infrared emitting surface 104A is located adjacent the front surface (upper surface) of the wafer W. Thus, the entire front surface of the wafer W is irradiated with the infrared radiation emitted from the infrared heater 103. A vertical distance between the front surface (upper surface) of the wafer W and the infrared radiation emitting surface 104A of the infrared heater 103 located at the adjacent position is, for example, about 3 mm.

With the infrared heater 103 located at the adjacent position, the liquid film of the phosphoric acid/suspension liquid mixture formed on the front surface of the wafer W is irradiated with the infrared radiation emitted from the infrared lamp 104. Silicon particles contained in the silicon suspension liquid have a relatively high infrared radiation absorptivity. Therefore, the silicon particles are heated by irradiating the silicon suspension liquid with the infrared radiation, whereby the temperature of the liquid film of the phosphoric acid/suspension liquid mixture is increased. Thus, the phosphoric acid aqueous solution and the silicon suspension liquid can be maintained at a higher temperature on the front surface of the wafer W for a longer period of time. Thereafter, as in the first preferred embodiment, an intermediate rinsing step (corresponding to Step S5 in FIG. 3), an SC1 treatment step (corresponding to Step S6 in FIG. 3), a final rinsing process (corresponding to Step S7 in FIG. 3), and a spin drying step (corresponding to Step S8 in FIG. 3) are performed.

Figure 7:
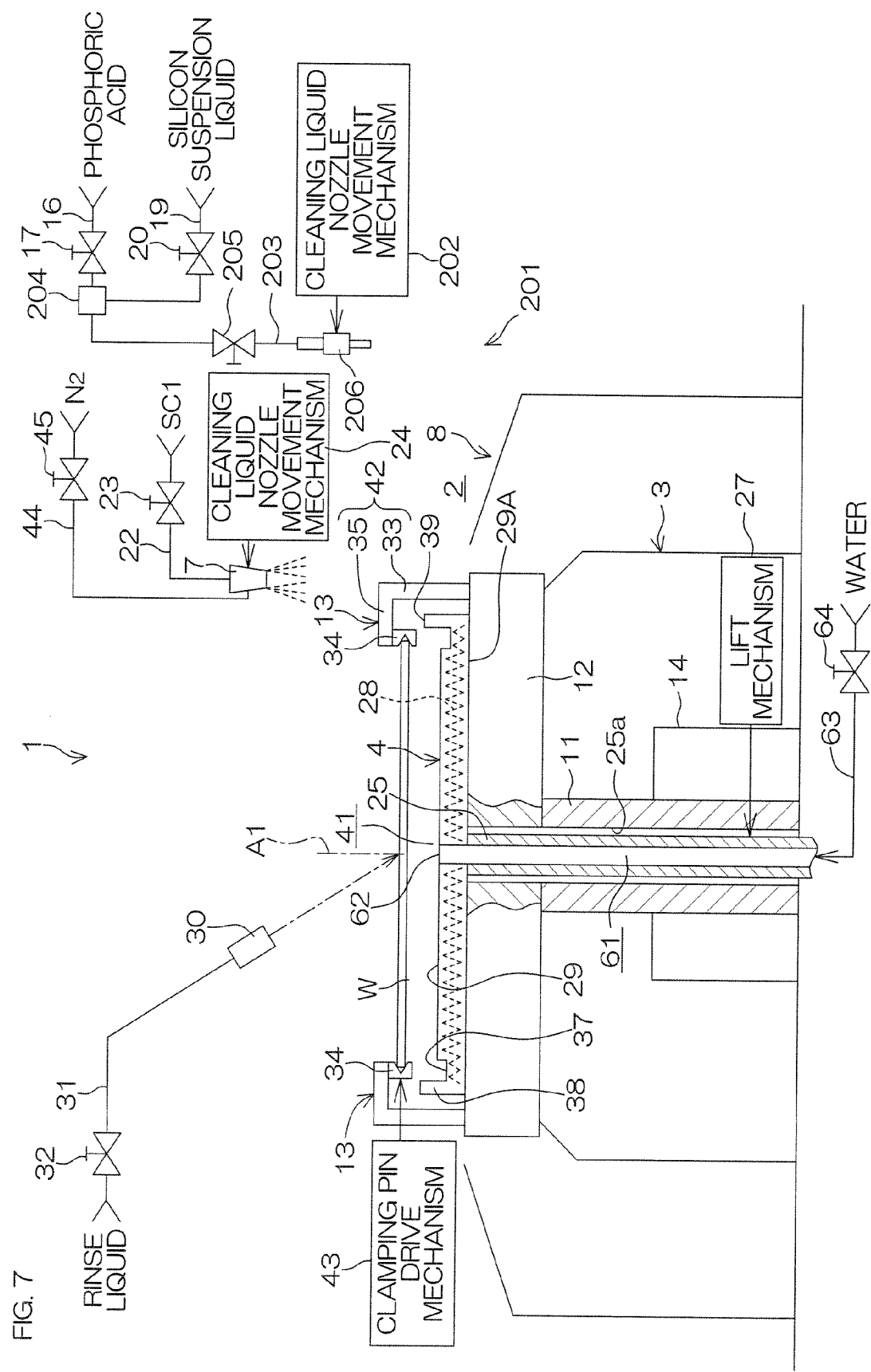
FIG. 7 is a sectional view schematically showing the construction of a substrate treatment apparatus according to a third preferred embodiment of the present invention.

FIG. 7 is a sectional view schematically showing the construction of a substrate treatment apparatus 201 according to a third preferred embodiment of the present invention. In FIG. 7, components corresponding to those shown in the first preferred embodiment will be designated by the same reference characters as in FIGS. 1 to 5, and duplicate description will be omitted.

The substrate treatment apparatus 201 differs from the substrate treatment apparatus 1 according to the first preferred embodiment in that a liquid mixture nozzle 206 which spouts a phosphoric acid/suspension liquid mixture is provided instead of the phosphoric acid nozzle 5, and the arrangement of the suspension liquid nozzle 6 is obviated.

The liquid mixture nozzle 206 is, for example, a straight nozzle which spouts the phosphoric acid/suspension liquid mixture downward in the form of a continuous stream. A liquid mixture nozzle movement mechanism 202 is connected to the liquid mixture nozzle 206. The liquid mixture nozzle movement mechanism 202 moves the liquid mixture nozzle 206 between a position above the spin chuck 3 and a home position defined on a lateral side of the spin chuck 3.

A mixer 204 is connected to the liquid mixture nozzle 206 through a liquid mixture supply pipe 203. The phosphoric acid supply pipe 16 and the suspension liquid supply pipe 19 are connected to the mixer 204. A liquid mixture valve 205 which opens and closes the liquid mixture supply pipe 203 is provided in the liquid mixture supply pipe 203. The flow rate ratio between the phosphoric acid aqueous solution to be supplied to the mixer 204 through the phosphoric acid supply pipe 16 and the silicon suspension liquid to be supplied to the mixer 204 through the suspension liquid supply pipe 19 is, for example, 1:1, or approximately 1:1.

When the phosphoric acid valve 17 and the suspension liquid valve 20 are opened with the liquid mixture valve 205 open, the phosphoric acid aqueous solution supplied from the phosphoric acid supply pipe 16 and the silicon suspension liquid supplied from the suspension liquid supply pipe 19 flow into the mixer 204. Then, the phosphoric acid aqueous solution and the silicon suspension liquid are mixed together in the mixer 204 to generate the phosphoric acid/suspension liquid mixture. The generated phosphoric aid/suspension liquid mixture is supplied to the liquid mixture nozzle 206 through the liquid mixture supply pipe 203, and spouted from an outlet port of the liquid mixture nozzle 206.

When the phosphoric acid etching process shown in FIG. 3 is performed by the substrate treatment apparatus 201, the phosphoric acid/suspension liquid mixture is spouted from the liquid mixture nozzle 206 to the front surface of the wafer W maintained at a higher temperature on the order of 300° C., whereby a liquid film of the phosphoric acid/suspension liquid mixture is formed on the front surface of the wafer W as covering the entire front surface of the wafer W. Then, the liquid film of the phosphoric acid/suspension liquid mixture is heated by the wafer W.

While the three preferred embodiments of the present invention have thus been described, the invention may be embodied in other ways.

For example, two or more of the first to third preferred embodiments may be combined together. More specifically, the second preferred embodiment and the third preferred embodiment may be combined together. In the second preferred embodiment, the liquid mixture nozzle 206 which spouts the phosphoric acid/suspension liquid mixture may be provided instead of the phosphoric acid nozzle 5, and the arrangement of the suspension liquid nozzle 6 may be obviated.

In the second preferred embodiment, the infrared heater 103 may be designed to have a sufficiently smaller diameter than the wafer W and adapted to be moved in the ON state in opposed relation to the front surface of the wafer W over the front surface of the wafer W. That is, an infrared irradiation region having a smaller size than the front surface of the wafer W may be moved within the front surface of the wafer W to uniformly heat the front surface of the wafer W and the liquid film covering the front surface.

The silicon suspension liquid to be supplied to the suspension liquid supply pipe 19 has a saturated silicon (Si) concentration by way of example, but a silicon suspension liquid having a silicon concentration less than the saturated concentration may be supplied to the suspension liquid supply pipe 19. Since the heat absorptive property of the silicon suspension liquid supposedly contributes to the improvement of the etching rate for the phosphoric acid etching process, the silicon particle concentration of the silicon suspension liquid is desirably higher. Therefore, the silicon suspension liquid desirably has a higher silicon concentration that is not lower than 100 ppm.

The heater 4, 103 is adapted to heat the wafer W so as to maintain the wafer W at a temperature of about 300° C. by way of example, but the maintenance temperature of the wafer W may be not lower than 300° C. or lower than 300° C. However, the maintenance temperature of the wafer W is preferably not lower than 250° C. in order to maintain the etching rate at a higher level in the phosphoric acid etching process.

In the first to third preferred embodiments, the retention pool 41 which retains the liquid is provided in the heater 4 or in the liquid retention vessel 102 by way of example, but the heater 4 and the liquid retention vessel 102 are not necessarily required to include the retention pool 41. That is, the outer peripheral wall 38 may be omitted from the heater 4 and the liquid retention vessel 102. Where the retention pool 41 is not required in the second preferred embodiment shown in FIG. 6, the liquid retention vessel 102 may be obviated. In this case, the spin chuck 3 is not necessarily required to be of the clamping type adapted to hold the wafer W with the clamping pins 34 kept in press contact with the peripheral edge of the wafer W, but may be a vacuum chuck which is adapted to suck the lower surface of the wafer W by the upper surface of the spin base 12.

While the present invention has been described in detail by way of the preferred embodiments thereof, it should be understood that these preferred embodiments are merely illustrative of the technical principles of the present invention but not limitative of the invention. The spirit and scope of the present invention are to be limited only by the appended claims.

This application corresponds to Japanese Patent Application No. 2012-217642 filed in the Japanese Patent Office on Sep. 28, 2012, the disclosure of which is incorporated herein by reference in its entirety.

What is claimed is:

1. A substrate treatment method comprising:
   - a higher temperature maintaining step of maintaining a substrate held by a substrate holding unit at a higher temperature that is not lower than 250° C.; and
   - a phosphoric acid/suspension liquid supplying step of supplying a phosphoric acid aqueous solution and a silicon suspension liquid to a front surface of the substrate held by the substrate holding unit.

2. The substrate treatment method according to claim 1, wherein both a nitride film and an oxide film are completely removed from the front surface of the substrate held by the substrate holding unit.

3. The substrate treatment method according to claim 1, wherein the silicon suspension liquid to be supplied to the front surface of the substrate in the phosphoric acid/suspension liquid supplying step is a silicon suspension liquid saturated with silicon.

4. The substrate treatment method according to claim 1, wherein the phosphoric acid/suspension liquid supplying step comprises:
   - a phosphoric acid liquid film forming step of forming a liquid film of the phosphoric acid aqueous solution on the front surface of the substrate held by the substrate holding unit; and
   - a silicon suspension liquid supplying step of supplying the silicon suspension liquid to the front surface of the substrate formed with the liquid film of the phosphoric acid aqueous solution after the phosphoric acid liquid film forming step.

5. The substrate treatment method according to claim 1, further comprising a cleaning step of cleaning the front surface of the substrate held by the substrate holding unit after the phosphoric acid/suspension liquid supplying step.

* * * * *